US010402508B2

(12) United States Patent
Chisholm

(10) Patent No.: US 10,402,508 B2
(45) Date of Patent: Sep. 3, 2019

(54) SYNTHESIZER DIAGNOSTIC CASSETTE SIMULATOR

(71) Applicant: GE HEALTHCARE LIMITED, Buckinghamshire (GB)

(72) Inventor: Robert F. Chisholm, Princeton, NJ (US)

(73) Assignee: GE HEALTHCARE LIMITED, Buckinghamshire (GB)

( * ) Notice: Subject to any disclaimer, the term of this patent is extended or adjusted under 35 U.S.C. 154(b) by 1106 days.

(21) Appl. No.: 14/346,754

(22) PCT Filed: Sep. 28, 2012

(86) PCT No.: PCT/US2012/057979
§ 371 (c)(1),
(2) Date: Mar. 24, 2014

(87) PCT Pub. No.: WO2013/049608
PCT Pub. Date: Apr. 4, 2013

(65) Prior Publication Data

US 2014/0229152 A1 Aug. 14, 2014

Related U.S. Application Data

(60) Provisional application No. 61/541,209, filed on Sep. 30, 2011.

(51) Int. Cl.

| | |
|---|---|
| ***G06G 7/48*** | (2006.01) |
| ***G06F 17/50*** | (2006.01) |
| ***B01J 19/00*** | (2006.01) |
| *G21G 1/00* | (2006.01) |

(52) U.S. Cl.
CPC ........ *G06F 17/5009* (2013.01); *B01J 19/004* (2013.01); *B01J 19/0093* (2013.01); *B01J 2219/00792* (2013.01); *B01J 2219/00799* (2013.01); *B01J 2219/00889* (2013.01); *B01J 2219/00952* (2013.01); *B01J 2219/00986* (2013.01); *G21G 1/0005* (2013.01)

(58) Field of Classification Search
CPC .. G06F 17/5009; B01J 19/004; B01J 19/0093
USPC .......................................... 703/6, 11, 12, 13
See application file for complete search history.

(56) References Cited

U.S. PATENT DOCUMENTS 7,016,461 B2 * 3/2006 Rotondo ................. A61B 6/14 378/39
8,287,819 B2 10/2012 Schmitz et al.
2006/0245980 A1 * 11/2006 Kiselev .................... A61J 3/00 422/130

(Continued)

FOREIGN PATENT DOCUMENTS

CN 102083525 A 6/2011
JP 2007-212240 A 8/2007

(Continued)

OTHER PUBLICATIONS

PCT/US2012/057979 ISRWO dated March 22, 2013.

*Primary Examiner* — Andre Pierre Louis
(74) *Attorney, Agent, or Firm* — Hanley, Flight and Zimmerman, LLC

(57) ABSTRACT

The present invention relates to a diagnostic device (400) for measuring component performance on an automated radio-pharmaceutical synthesis device (50).

20 Claims, 4 Drawing Sheets

(56) References Cited

U.S. PATENT DOCUMENTS

| | | | | |
|---|---|---|---|---|
| 2009/0155167 | A1 | 6/2009 | Powell et al. | |
| 2010/0106012 | A1* | 4/2010 | De Marco | F16K 5/0407 600/431 |
| 2012/0107175 | A1 | 5/2012 | Satyamurthy et al. | |
| 2013/0053994 | A1* | 2/2013 | Rensch | G06F 19/3406 700/95 |
| 2015/0196672 | A1* | 7/2015 | Cesati | C07F 7/12 424/1.89 |

FOREIGN PATENT DOCUMENTS

| | | | |
|---|---|---|---|
| JP | 2004-515330 | A | 2/2009 |
| JP | 2009-511458 | A | 3/2009 |
| WO | 2008/128201 | A1 | 10/2008 |

* cited by examiner

400

SYNTHESIZER DIAGNOSTIC CASSETTE SIMULATOR

This application is a filing under 35 U.S.C. 371 of international application number PCT/US2012/057979, filed Sep. 28, 2012, which claims priority to U.S. application No. 61/541,209 filed Sep. 30, 2011, the entire disclosure of which is hereby incorporated by reference.

FIELD OF THE INVENTION

The present invention relates to the field of automated synthesis devices, such as those for producing radiopharmaceuticals used in Positron Emission Tomography (PET) and Single-Photon Emission Computed Tomography (SPECT). More particularly, the present invention is directed to a diagnostic device for measuring component performance on an automated synthesis device.

BACKGROUND OF THE INVENTION

Automated synthesis systems are growing in importance for the production of radiopharmaceuticals. Synthesis systems, such as the FASTlab® system, sold by GE Healthcare of Liege, Belgium, provide for small-scale production of doses for clinical applications. The FASTlab synthesizer accepts and operates a cassette thereon for producing a radiopharmaceutical such as $^{18}$F-FLT ([$^{18}$F]fluorothymidine), $^{18}$F-FDDNP (2-(1-{6-[(2-[$^{18}$F]fluoroethyl)(methyl) amino]2-naphthyl}ethylidene)malonitrile), $^{18}$F-FHBG (9-[4-[$^{18}$F]fluoro-3-(hydroxymethyl)butyl]guanine or [$^{18}$F]-penciclovir), $^{18}$F-FESP ([$^{18}$F]-fluoroethylspiperone), $^{18}$F-p-MPPF (4-(2-methoxyphenyl)-1-[2-(N-2-pyridinyl)-p-[18p] fluorobenzamido]ethylpiperazine) and $^{18}$F-FDG ([$^{18}$F]-2-deoxy-2-fluoro-D-glucose) and the like.

The cassette typically includes a reaction vessel, a distillation vessel, reagent vials, cartridges, filters, syringes, tubings, and connectors for synthesizing a particular radiotracer. Different radiopharmaceuticals are made using cassettes customized for that radiopharmaceutical. The synthesis device, onto which the cassette is mounted, is configured to cooperatively engage the cassette so as to be able to actuate each of the stopcocks and syringes to drive a source fluid with a radioisotope through the cassette for performance of a chemical synthesis process. Additionally, the synthesis device includes a heating cavity which receives the first reaction vessel of the cassette therein so as provide the heat required for chemical reactions occurring therein.

The synthesizer is programmed to operate pumps, syringes, valves, the heating element, as well as controlling the provision of a motive gas (e.g., nitrogen) and the application of vacuum to the cassette so as to direct the source fluid into mixing with the reagents, performing the chemical reactions, through the appropriate purification cartridges, and selectively pumping the output tracer and waste fluids into appropriate vial receptacles, which are outside the cassette. While the fluid collected in the output vial is typically input into another system for either purification and/or dispensement, the synthesizer and cassette can also be connected to a separate purification system which returns a purified compound back to the cassette for further processing.

While quality control tests can determine whether a synthesized radiotracer product is suitable for use, the failure of a product to pass its quality review can be indicative of a problem in either the cassette or the synthesizer. As synthesizers, such as FASTlab, become more widely-used for the production of radiotracer products, there is a need in the art for a diagnostic device which can monitor synthesizer performance so as to detect any components of the synthesizer which are not performing to specifications or set standards.

SUMMARY OF THE INVENTION

In view of the needs of the prior art, the present invention provides a cassette diagnostic simulator for mating to a synthesis device. The simulator's cassette of the present invention appears to the synthesizer to be a normal cassette used for radiopharmaceutical synthesis, as described above, but instead is configured to provide the capability for measuring the performance of each of the synthesizer components which engage or act upon the cassette. Performance of each of the components can then be compared to a specification or pre-determined benchmark or standard to determine whether the components are in proper working order and operating as required/desired. The present invention will thus allow diagnostic evaluation of the synthesizer under normal working conditions, without the use of actual production cassette.

In one embodiment, the simulator of the present invention provides diagnostic elements such rotatable stopcocks, linearly reciprocal syringe piston rods, and at least one pressure measuring device for connection to, and operation by, a synthesizer. Each of the respective movements or pressures will be measured for comparison to a reference specification. The measurements can include the degree of movement and/or pressurization, as well as the time at, and the duration for, which the movement and pressurization occur. The simulator may provide for external communication of one or more of its diagnostic elements to an external recorder, such as a computer, or may record the performance of one or more components on the simulator itself. This recordation can be output at a later time (e.g., following the simulation diagnostic run).

The present invention may be used to diagnose the synthesizer performance according to any protocol for which the synthesizer has been programmed. It is contemplated that the synthesizer will run a normal production protocol based on the type of cassette or radiotracer it expects to be synthesizing and the respective program will be run. Although the present invention also contemplates that the synthesizer could be set to run a protocol designed simply to test each of the components acting upon the cassette (e.g., a "test" mode).

Figure 1:
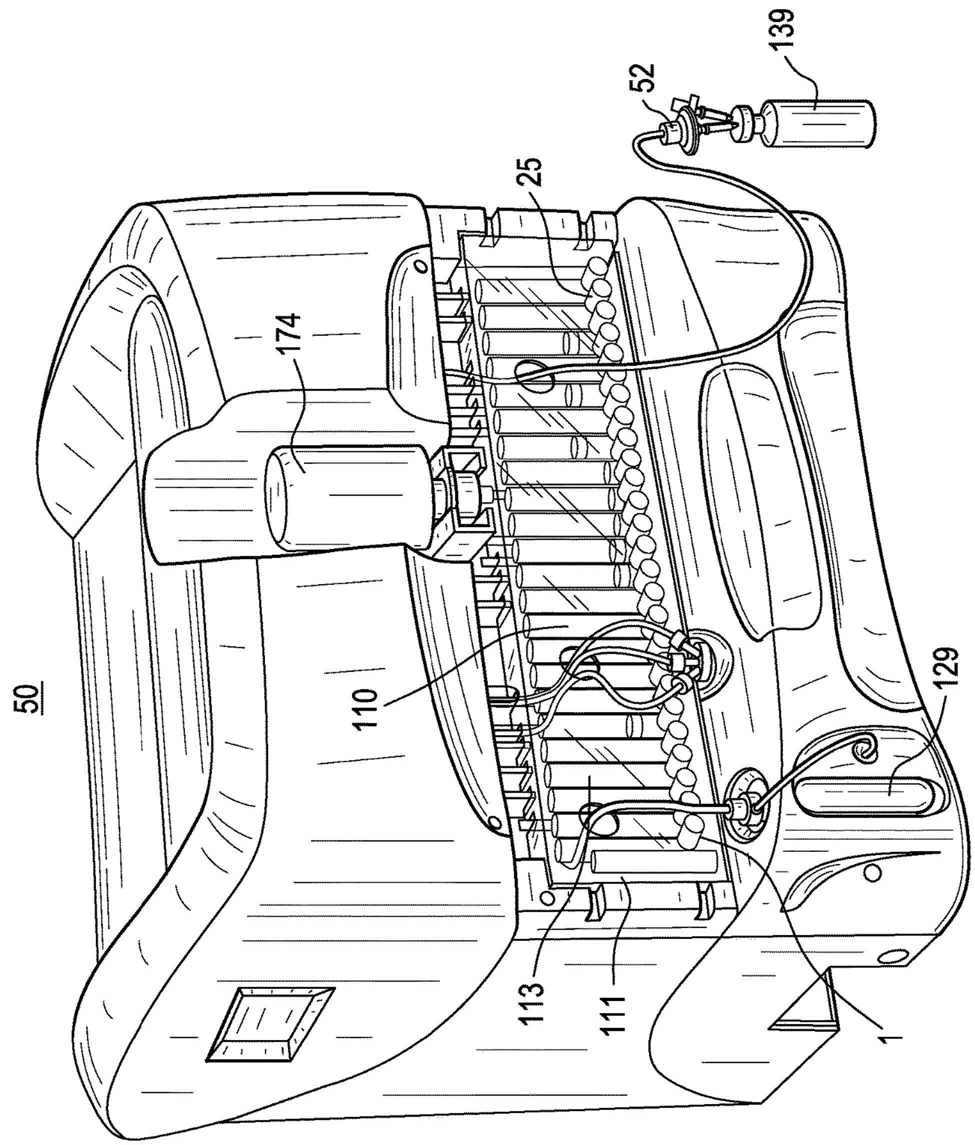
FIG. 1 depicts a synthesizer with a cassette to be attached thereto according to exemplary embodiments.

These and other embodiments and advantages of the invention will become apparent from the following detailed description, taken in conjunction with the accompanying drawings, illustrating by way of example the principles of the various exemplary embodiments of the invention.

DETAILED DESCRIPTION OF THE PREFERRED EMBODIMENTS

It will be readily understood by those persons skilled in the art that the embodiments of the inventions described herein are capable of broad utility and application. Accordingly, while the invention is described herein in detail in relation to the exemplary embodiments, it is to be understood that this disclosure is illustrative and exemplary of embodiments and is made to provide an enabling disclosure of the exemplary embodiments. The disclosure is not intended to be construed to limit the embodiments of the invention or otherwise to exclude any other such embodiments, adaptations, variations, modifications and equivalent arrangements.

The simulator mates to a synthesizer as a normal, operational cassette for that synthesizer would mate. All connections between the cassette and the synthesizer are made to the simulator of the present invention. That is, the simulator cassette can be mated with a synthesizer as if it were an operational cassette being used to produce an actual radiopharmaceutical. For example, the simulator can be configured to mate with a FASTlab synthesizer. It should be appreciated that while FASTlab may be used in examples described herein, these examples are meant to be illustrative of exemplary embodiments and non-limiting.

The simulator detects and measures the amount and timing of the following:

- Rotation of each rotatable arm of the synthesizer;
- Application of motive gases from synthesizer to cassette (both vacuum and positive pressure). While water for injection is connected to the simulator cassette to provide a motive fluid, this does not need to be tested by the simulator. Simply, the simulator will provide pressure meters connected at each gas port from the synthesizer so that the requisite positive and negative pressures can be detected and desirably measured and recorded;
- Reciprocal movement of arms used to engage syringe pumps. Simulator provides syringe piston rod member which synthesizer will engage and move. Movement of the simulator's piston rods will be detected, as well as desirable measured, and recorded;
- Movement of synthesizer arms to impale each reagent container on its underlying spike so that the contents of the reagent container can be directed into the manifold (this is a one-time, one-way motion). This motion is desirably measured and recorded, although a single translation of a diagnostic element may be sufficient (presuming the device is not able to retract or move further on its own); and
- Operation of heating well (to check that the reaction vessel would be heated at the correct temperature for correct duration at the correct time).

The simulator allows determination that synthesizer is performing within specification; that is, operating properly and as expected. All required circuitry to detect synthesizer performance to required specifications is desirably included in the simulator. Additionally, the simulator may require the circuitry for comparing the synthesis performance to the required specification. For example, the required circuitry can include a memory for receiving and storing expected performance reports from each component on the simulator and a program to compare received reports with expected performance, as well as an indicator signal for indicating whether performance was within or outside of specified limits. More than one indicator may be present to indicate performance of different components. The indicator(s) may be a series of lights or a textual or graphical display with the results. It is desirable to record the performance of the synthesizer during the test. Accordingly, the simulator can provide data to an external computing device to comparing actual synthesizer performance to required or desired specifications. Such provision of data can be provided in a number of different manners, including, but not limited to: a hard-wire connection, a wireless connection, and/or a remote connection (i.e., over internet to a central monitoring station). A combination of connections may be used. The external computing device can be a computer or server.

The simulator can collect signals from one or more diagnostic elements or sensors (e.g., for one or more of the stopcocks), with the signals being indicative of the component performance to which the elements pertain. The diagnostic elements can include, by way of non-limiting examples, such elements as mechanical sensors, electrical sensors, electro-mechanical sensors, electronic sensors, transducers, resistive sensors, capacitive sensors, electromagnetic sensors, switches, optical sensors, magnetic sensors, and/or inductive sensors. These elements can be configured, by way of non-limiting example, to sense motion, distance, temperature, pressure, and/or flow. The diagnostic elements can be configured to sense, record, and transmit the measured quantity. The diagnostic elements may be configured to perform a comparison between the measured quantity and a reference standard or set-point and to output the result of this comparison.

It is also contemplated by the present invention that some of the diagnostic elements may be visually inspected to ensure the synthesizer performed as required. For example, spiking of the reagent vials on their respective underlying cannula may be simulated by moving a slideable piston some minimum distance within the simulator. It is contemplated that the synthesizer will run a normal production protocol based on the type of cassette or radiotracer it expects to be synthesizing and the respective program that will be run. Although the present invention also contemplates that the synthesizer could be set to run a protocol designed simply to test each of the components acting upon the cassette (a "test" mode). For example, the synthesizer may operate the simulator as though it were producing a radiopharmaceutical, such as $^{18}$F-FDG. The signals provided by the diagnostic elements correspond to the movement of the respective synthesizer components. These signals can be compared to what an $^{18}$F-FDG cassette should "expect to see" based on a specification or protocol for the synthesizer program. Alternatively, rather than have the synthesizer run an entire production protocol, the synthesizer may be programmed to run a "test mode" in a shorter period of time, but in a manner which still allows evaluation of synthesizer components.

The power source for the simulator can be internal (i.e., battery) or external (i.e., a connection to a fixed power source).

An operator can provide an inert fluid to simulate the output (e.g., the radioisotope fluid) from a cyclotron. For example, FASTlab accepts a fluid conduit therethrough (which is regularly changed) for directing fluid from a reservoir/cyclotron to the cassette. With the present invention, it is desirable that this source conduit provide an inactive, or radioactively cold, fluid which can simply collect in a reservoir provided on the simulator. The simulator can also be configured to determine that the volume provided of this fluid is within specifications. For example, the reservoir provided on the simulator could include a transparent window showing graduated volume markings along it, providing a visual indication of the volume provided by the synthesizer. Other means for determining volume could also be provided.

FIG. 1 depicts a synthesizer 50 with a synthesis cassette 110 mated thereto according to exemplary embodiments mated thereto. The synthesizer 50 is a automated synthesizer platform for radiopharmaceuticals. For example, the synthesizer 50 may be a FASTlab system as described above. Although a FASTlab unit is depicted, this is meant to be a non-limiting example, as the synthesizer 50 may be a different synthesizer system as appreciated by one of ordinary skill in the art. The cassette 110 mates with the synthesizer 50. The cassette 110 is a disposable cassette having a single use reagent set and fluid path. According to exemplary embodiments, the cassette 110 may be a simulator cassette for use as described herein. The cassette 110 is described in detail with respect to FIGS. 2-4 below. A portion of the components of the cassette 110 are labeled in FIG. 1 to provide reference regarding the orientation of the cassette 110 when mated to the synthesizer 50.

The synthesizer 50 is programmed to operate pumps, syringes, valves, the heating element, as well as controlling the provision of a motive gas (e.g., nitrogen) and the application of vacuum to the cassette so as to direct the source fluid into mixing with the reagents, performing the chemical reactions, through the appropriate purification cartridges, and selectively pumping the output tracer and waste fluids into appropriate vial receptacles. While the fluid collected in the output vial is typically input into another system for either purification and/or dispensement, the synthesizer and cassette can also be connected to a separate purification system which returns a purified compound back to the cassette for further processing. A sterilizing filter 52 and a product collection vial 139 are shown. The product collection vial 139 is a sterile collection vial.

Figure 2:
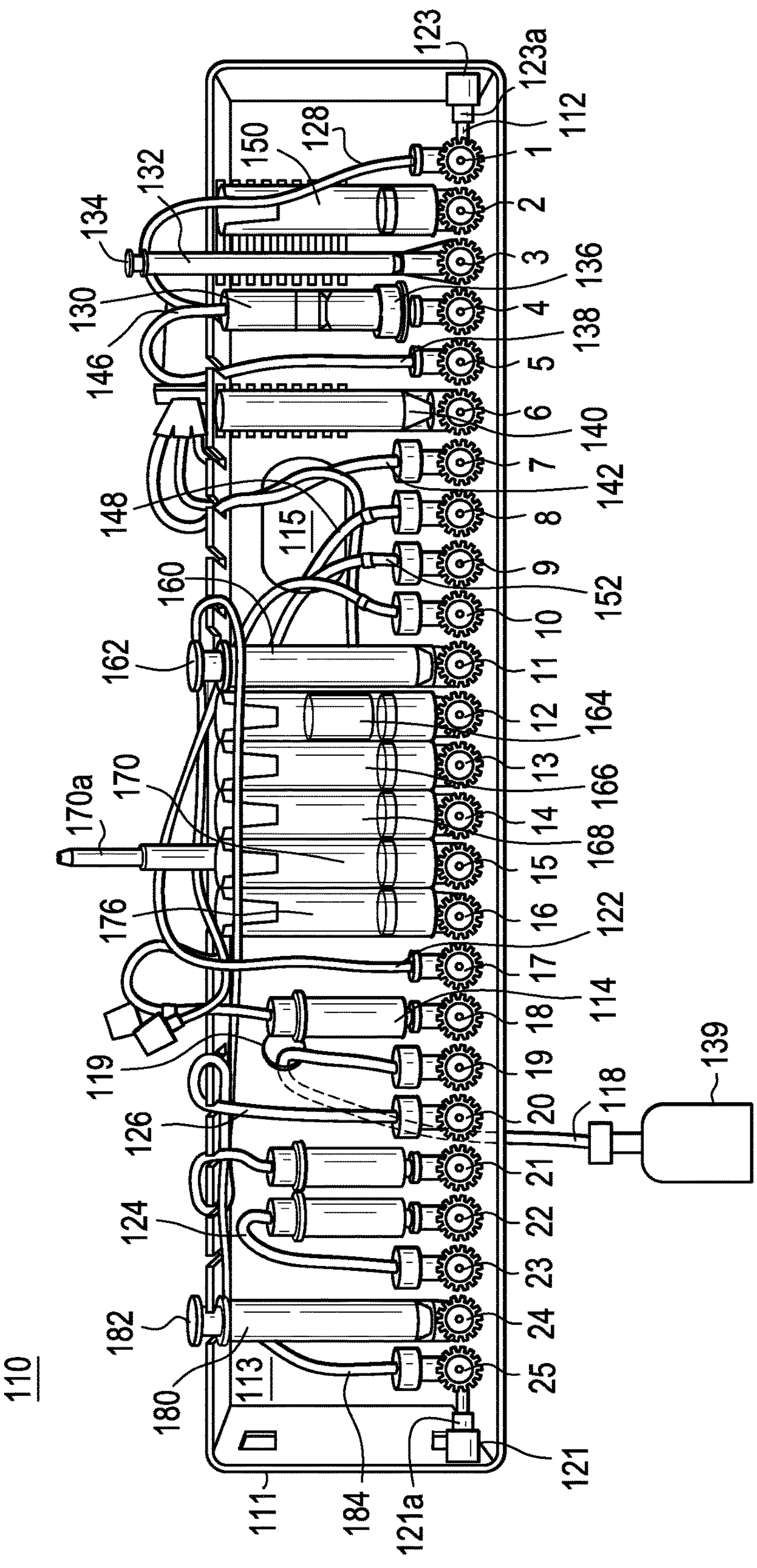
FIG. 2 depicts a cassette of FIG. 1 according to exemplary embodiments.

A description of an exemplary simulator cassette will now be provided with reference to FIG. 2. FIG. 2 depicts the disposable synthesis cassette 110 and its components according to exemplary embodiments. The simulator cassette according to exemplary embodiments may be configured as a standard synthesis cassette for radiopharmaceutical production is configured. Cassette 110 includes, a manifold 112 including twenty-five 3-way/3-position stopcocks valves 1-25, respectively. Manifold valves 1-25 are also referred to as their manifold positions 1-25 respectively, as more clearly shown in FIG. 2. Manifold valves 1, 4-5, 7-10, 17-23, and 25 have female luer connectors projecting up therefrom. Valves 2, 6, and 12-16 have an elongate open vial housing upstanding therefrom and support an upstanding cannula therein for piercing a reagent vial inserted in the respective vial housing. Movement of the reagent vial to be pierced by the respective cannula is performed under actuation by the synthesizer device. Valves 3, 11, and 24 support an elongate open syringe barrel upstanding therefrom. Valves 1-25 include three open ports opening to adjacent manifold valves and to their respective luer connectors, cannulas, and syringe barrels. Each valve includes a rotatable stopcock which puts any two of the three associated ports in fluid communication with each other while fluidic ally isolating the third port. Manifold 112 further includes, at opposing ends thereof, first and second socket connectors 121 and 123, each defining ports 121*a* and 123*a*, respectively. Manifold 112 and the stopcocks of valves 1-25 are desirably formed from a polymeric material, e.g., polypropylene, polyethylene, polysulfone, Ultem®, or Peek™.

Cassette 110 is a variant of a pre-assembled unit designed to be adaptable for synthesizing clinical batches of different radiopharmaceuticals with minimal customer installation and connections. Cassette 110 includes reaction vessel, reagent vials, cartridges, filters, syringes, tubing, and connectors for synthesizing a radiopharmaceutical according to the present invention. Connections are desirably automatically made to the reagent vials by driving the septums thereof onto penetrating spikes to allow the synthesizer access to the reagents.

Cassette 110 is attachable to a synthesis device, such as, for example, FASTlab, which cooperatively engages the cassette so as to be able to actuate each of the stopcocks and syringes to drive a source fluid with a radioisotope through the cassette for performance of a chemical synthesis process. Additionally, the synthesis device can provide heat to the reaction vessel of cassette 110 as required for chemical reactions. The synthesizer is programmed to operate pumps, syringes, valves, heating element, and controls the provision of nitrogen and application of vacuum to the cassette so as to direct the source fluid into mixing with the reagents, performing the chemical reactions, through the appropriate purification cartridges, and selectively pumping the output tracer and waste fluids into appropriate vial receptacles outside the cassette. The fluid collected in the output vial is typically input into another system for either purification and/or dispensement. After product dispensement, the internal components of cassette 110 are typically flushed to remove latent radioactivity from the cassette, although some activity will remain. Cassette 110 thus can be operated to perform a two-step radiosynthesis process.

Figure 3:
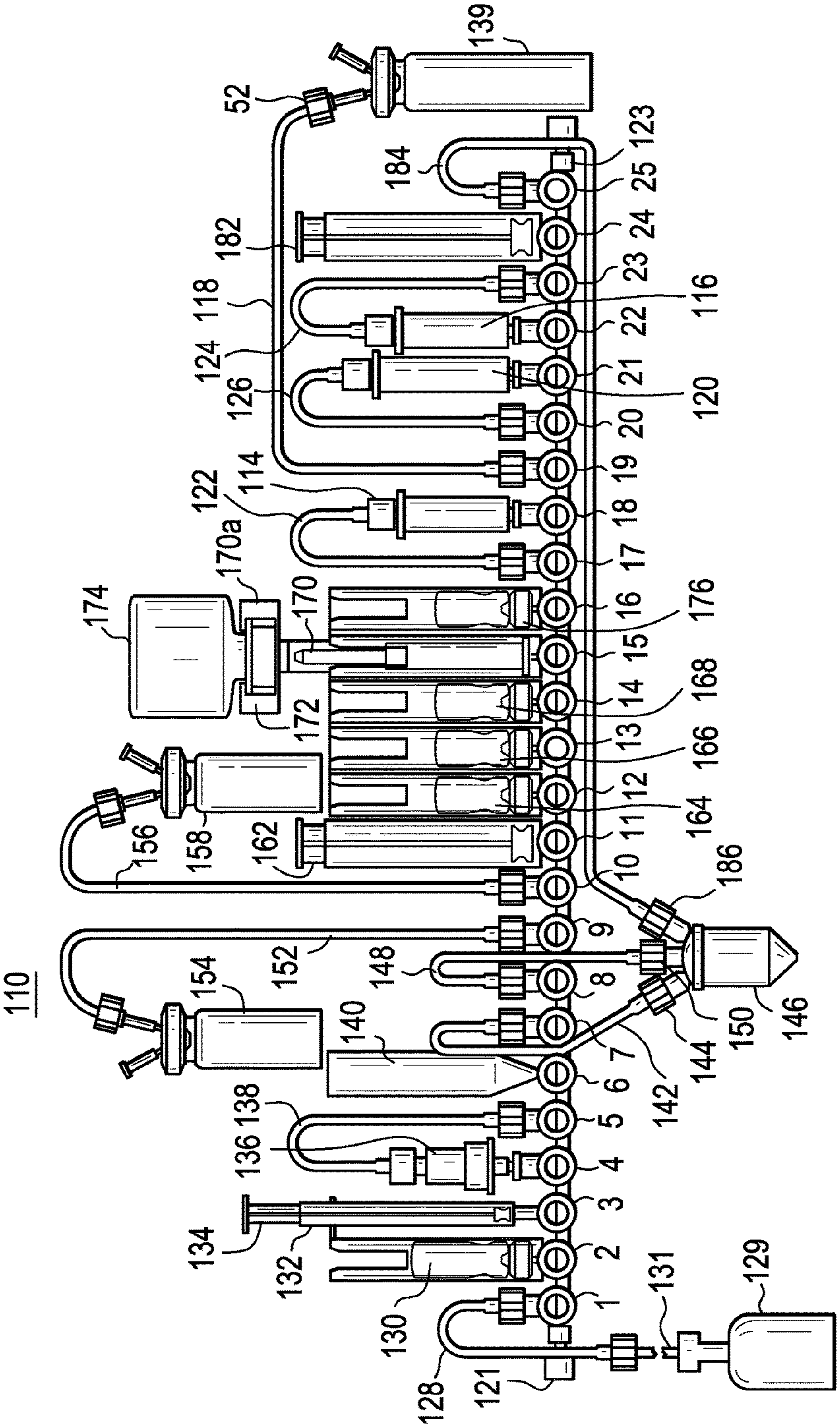
FIG. 3 depicts the connections of the cassette of FIG. 2 to a synthesizer according to exemplary embodiments.

FIG. 3 depicts the connections to the manifold of cassette 110 for the production of Flutemetamol ($^{18}F$) Injection, showing all tubing and prefilled reagent vials. While the cassette for producing Flutemetamol ($^{18}F$) Injection is shown and described, the shield collar of the present invention is not limited to such a cassette or tracer and is contemplated to be suitable for any combination of cassette and purification cartridge for which it may be adapted. Cassette 110 includes a polymeric housing 111 having a planar major front surface 113 and defining a housing cavity 115 in which manifold 112 is supported. As depicted in FIG. 1, the front surface 113 of the housing 113 may be transparent.

A first reverse phase SPE Cartridge 114 is positioned at manifold position 18 while a second reverse phase SPE cartridge 116 is positioned at manifold position 22. A normal phase (or amino) SPE cartridge 120 is located at manifold position 21. First SPE Cartridge 114 is used for primary purification. The amino cartridge 120 is used for secondary purification. The second SPE cartridge 116 is used for solvent exchange. A 50 cm to over 2 m length of Tygon® tubing 118 is connected between cassette position 19 and a product collection vial 139 in which collects the formulation of the drug substance. The product collection vial 139 may have a sterilizing filter 52 attached (see FIG. 1). Tubing 118 is shown in partial phantom line (in FIG. 2) to indicate where is passing behind front surface 113 on the far side of manifold 112 in the view. While some of the tubings of the cassette are, or will be, identified as being made from a specific material, the present invention contemplates that the tubings employed in cassette 110 may be formed from any suitable polymer and may be of any length as required. Surface 113 of housing 111 defines an aperture 119 through which tubing 118 transits between valve 19 and the product collection vial 139. FIG. 3 depicts the same assembled manifold of the cassette and shows the connections to a vial containing a mixture of 40% MeCN and 60% water at manifold position 9, a vial of 100% MeCN at manifold position 10, a water vial connected at the spike of manifold position 14, and a product collection vial connected at manifold position 19. FIG. 3 depicts manifold 112 from the opposite face, such that the rotatable stopcocks and the ports 121*a* and 123*a* are hidden from view.

A 14 cm length of a tubing 122 extends between the free end of cartridge 114 and the luer connector of manifold valve 17. An 8 cm length of tubing 124 extends between the free end of cartridge 116 and the luer connector of manifold valve 23. A 14 cm length of tubing 126 extends between the free end of cartridge 120 and the luer connector of manifold valve 20. Additionally, tubing 128 extends from the luer connector of manifold valve 1 to a target recovery vessel 129 (shown in FIGS. 1 and 3) which recovers the waste enriched water after the fluoride has been removed by the QMA cartridge. The free end of tubing 128 supports a connector 131, such as a luer fitting or an elongate needle and associated tubing, for connecting the cavity to the target recovery vessel 129. In the method of the present invention, the radioisotope is [$^{18}$F]fluoride provided in solution with $H_2$[$^{18}$O] target water and is introduced at manifold valve 6.

A tetrabutylammonium bicarbonate eluent vial 130 is positioned within the vial housing at manifold valve 2 and is to be impaled on the spike therein. An elongate 1 mL syringe pump 132 is positioned at manifold valve 3. Syringe pump 132 includes an elongate piston rod 134 which is reciprocally moveable by the synthesis device to draw and pump fluid through manifold 112 and the attached components. QMA cartridge 136 is supported on the luer connector of manifold valve 4 and is connected via a 14 cm length of silicone tubing 138 to the luer connector of manifold position 5. Cartridge 136 is desirably a QMA light carbonate cartridge sold by Waters, a division of Millipore. The tetrabutylammonium bicarbonate in an 80% acetonitrile; 20% water (v/v) solution provides elution of [$^{18}$F]fluoride from QMA and phase transfer catalyst. A fluoride inlet reservoir 140 is supported at manifold valve 6.

Manifold valve 7 supports a tubing 142 at its luer connector which extends to a first port 144 of a reaction vessel 146. The luer connector of manifold valve 8 is connected via a 14 cm length of tubing 148 to a second port 150 of reaction vessel 146. The luer connector of manifold valve 9 is connected via a 42 cm length of tubing 152 to a vial 154 containing a mixture of 40% MeCN and 60% water (v/v). The acetonitrile and water mixture is used to enable primary purification of Flutemetamolat the first SPE cartridge 114. The luer connector of manifold valve 10 is connected via a 42 cm length of tubing 156 to a vial 158 containing 100% MeCN used for conditioning of the cartridges and the elution of Flutemetamol from the first SPE cartridge 114. Manifold valve 11 supports a barrel wall for a 5 mL syringe pump 160. Syringe pump 160 includes an elongate piston rod 162 which is reciprocally moveable by the synthesis device so as to draw and pump fluid through manifold 112. The vial housing at manifold valve 12 receives vial 164 containing 6-ethoxymethoxy-2-(4'-(N-formyl-N-methyl) amino-3'-nitro)phenylbenzothiazole). The vial housing at manifold valve 13 receives a vial 166 containing 4M hydrochloric acid. The hydrochloric acid provides de-protection of the radiolabelled intermediate. The vial housing at manifold valve 14 receives a vial 168 of a methanol solution of sodium methoxide. The vial housing at manifold valve 15 receives an elongate hollow spike extension 170 which is positioned over the cannula at manifold valve 15 and provides an elongate water bag spike 170*a* at the free end thereof. Spike 170 pierces a cap 172 of a water bottle 174 containing water for both diluting and rinsing the fluid flowpaths of cassette 110. The vial housing at manifold valve 16 receives a vial 176 containing ethanol. Ethanol is used for the elution of the drug substance from the second SPE cartridge 116. The luer connector of manifold valve 17 is connected to a 14 cm length of silicone tubing 122 to SPE cartridge 114 at position 18. Manifold valve 24 supports the elongate barrel of a 5 ml syringe pump 180. Syringe pump 180 includes an elongate syringe rod 182 which is reciprocally moveable by the synthesis device to draw and pump fluid through manifold 112 and the attached components. The luer connector of manifold valve 25 is connected to a 42 cm length of a tubing 184 to a third port 186 of reactor vessel 146.

Cassette 110 is mated to an automated synthesizer having rotatable arms which engage each of the stopcocks of valves 1-25 and can position each in a desired orientation throughout cassette operation. The synthesizer also includes a pair of spigots, one of each of which insert into ports 121*a* and 123*a* of connectors 121 and 123 in fluid-tight connection. The two spigots respectively provide a source of nitrogen and a vacuum to manifold 112 so as to assist in fluid transfer therethrough and to operate cassette 110 in accordance with the present invention. The free ends of the syringe plungers are engaged by cooperating members from the synthesizer, which will then apply the reciprocating motion thereto within the syringes. A bottle containing water is fitted to the synthesizer then pressed onto spike 170 to provide access to a fluid for driving compounds under operation of the various-included syringes. The reaction vessel will be placed within the reaction well of the synthesizer and the product collection vial and waste vial are connected. The synthesizer includes a radioisotope delivery conduit which extends from a source of the radioisotope, typically either vial or the output line from a cyclotron, to a delivery plunger. The delivery plunger is moveable by the synthesizer from a first raised position allowing the cassette to be attached to the synthesizer, to a second lowered position where the plunger is inserted into the housing at manifold valve 6. The plunger provides sealed engagement with the housing at manifold valve 6 so that the vacuum applied by the synthesizer to manifold 112 will draw the radioisotope through the radioisotope delivery conduit and into manifold 112 for processing. Additionally, prior to beginning the synthesis process, arms from the synthesizer will press the reagent vials onto the cannulas of manifold 112. The synthesis process may then commence.

Figure 4:
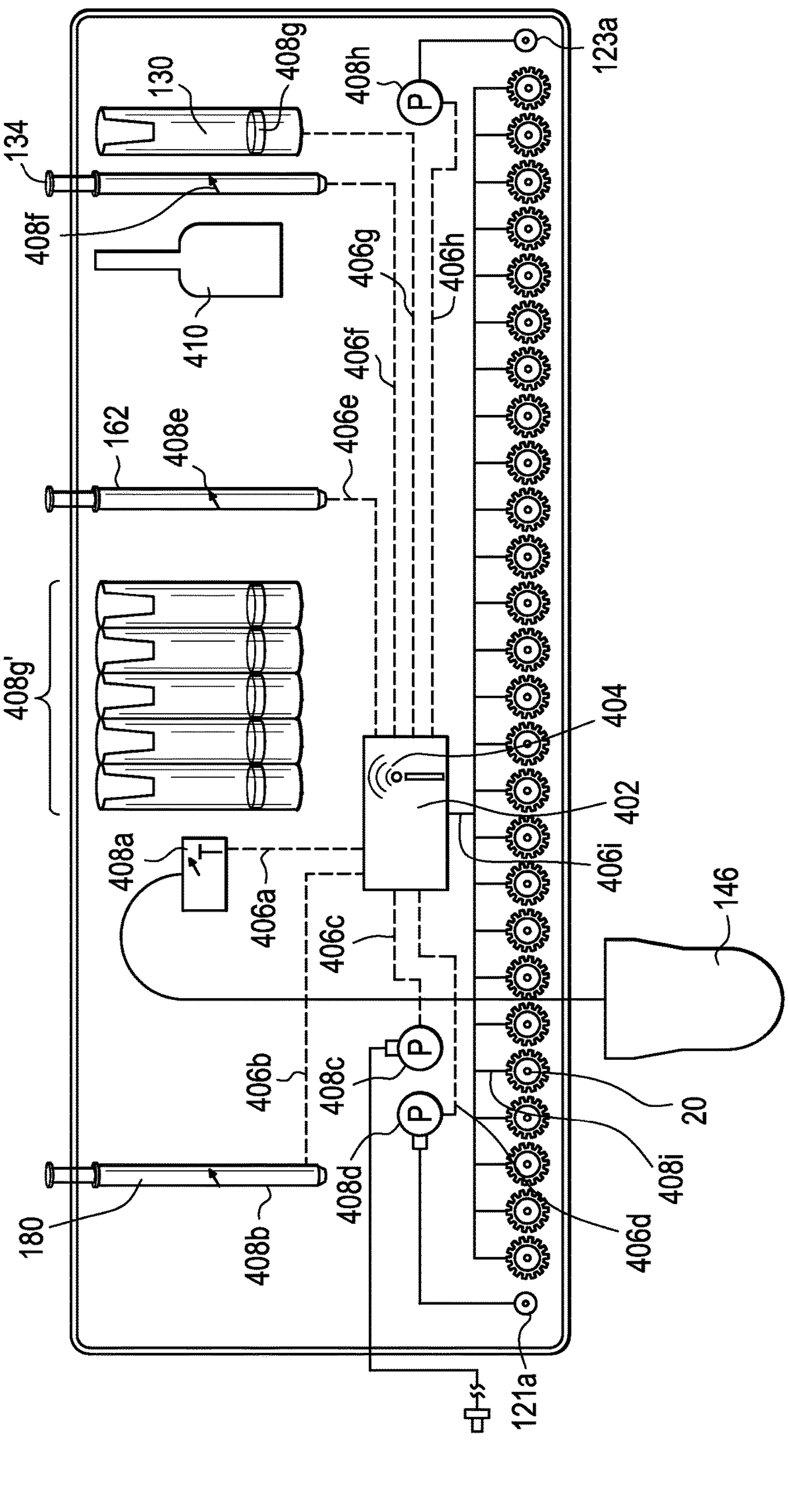
FIG. 4 depicts a synthesizer cassette diagnostic simulator according to exemplary embodiments.

FIG. 4 depicts a synthesizer cassette diagnostic simulator 400. The cassette 400 may be configured as described above with respect to FIGS. 1-3. The cassette 400 may have additional components, such as diagnostic elements and processor, contained therein to effect the diagnostic simulation as described herein. A processing unit 402 serves as a central collection point for measurement data from various sensors located in the cassette 400. The processing unit 402 may contain one or more computer processors and storage components. The storage components may be computer memory or other storage media, permanent and/or temporary storage, such as a hard drive and/or flash memory. The processing unit 402 may receive data/measurements from various diagnostic elements. The processing unit 402 may record and analyze this data. In some embodiments, the diagnostic elements themselves may perform a comparison of the measured quantity or data to a reference point or setting, and provide the result of this comparison to the processing unit with the measured quantity. The processing unit 402 may be programmable and capable of running software routines. In some embodiments, the processing unit 402 may be a receptor for raw data without analysis capability. The cassette 400 may have either an internal or external power source. For example, the cassette 400 may have a battery or other power source connected thereto.

The processing unit 402 is shown have a wireless transmitter 404. The wireless transmitter 404 enables the cassette 400 to communicatively couple with an external device to transmit the collected data. The wireless transmission may be over a computer based network. The external device (not shown) may be a computing device. In alternative embodiments, the wireless transmitter may be replaced by a port or other connection point to allow for the physical connection to an external device. For example, a cable may be connected to the cassette 400 through a port to establish a communicative coupling between the cassette and an external computing device through a computer based network. In such embodiments, the signals received from each diagnostic element may be transmitted to an outside computer which will perform the comparison of the synthesizer performance to the specification. In other embodiments, a flash drive or other storage media may be connected to the port to provide for the collection point for the measured data. The storage media may then be removed and connected to a computing device for transfer and/or analysis of the data.

According to some embodiments the wireless transmitter 404 may have a receiver or be configured as a transceiver to allow for the receipt of data/information. If configured as a port, then the port may be a two-way port, capable of transmission and receipt of data. Such a configuration allows for the uploading of instructions and/or programming to the processing unit 402.

Connections 406*a-i* represent coupling between the processing unit 402 and various diagnostic elements 408*a-i*, which include sensors and other measurement devices, on the cassette 400. The connections 406*a-i* may be wired or wireless connections. A combination of connections may be used such that a portion of the connections 406*a-i* may differ from one another. For example, a mix of wireless and wired connections may be used. It should be appreciated that the diagnostic elements 408*a-i* depicted in FIG. 4 are exemplary and non-limiting. Further, the locations depicted by the reference numbers are general locations and are not intended to represent the exact locations or configurations of a particular diagnostic element 408*a-i* or connection 406*a-i*. One of ordinary skill the art would appreciate a variety of diagnostic element types and arrangements that are possible without departing from the scope of the present invention.

The diagnostic elements 408*a-i* can include, by way of non-limiting examples, such elements as mechanical sensors, electrical sensors, electro-mechanical sensors, electronic sensors, transducers, resistive sensors, capacitive sensors, electromagnetic sensors, switches, optical sensors, magnetic sensors, and/or inductive sensors. These elements can be configured, by way of non-limiting example, to sense motion, distance, temperature, pressure, and/or flow. The diagnostic elements may be configured to simulate the actual movement and actions of a production cassette. The diagnostic elements may therefore provide resistance to movement in the manner of a production cassette. The diagnostic elements can be configured to sense, record, and transmit the measured quantity. The diagnostic elements may, in some cases, be simulators capable of simulating a movement, pressure, and/or temperature associated with a particular element on the cassette. The simulator may be configured to actuate an element, such as a syringe pump or stopcock valve, in response to a command or signal from the synthesizer, just as a normal or production cassette would behave. The diagnostic element can then record the reaction or movement of the cassette element for recordation and analysis.

Each diagnostic element may be a self-contained unit. The diagnostic elements may be modular in structure to permit ease of access and replacement. For example, the diagnostic elements may be of "plug and play" type structures. The diagnostic elements may be configured to perform a comparison between the measured quantity and a reference standard or set-point and to output the result of this comparison and/or output the measured quantity. According to some embodiments, the diagnostic elements may each output data to one or more external devices. In this embodiment, the processing unit 402 may be bypassed.

By way of non-limiting examples, diagnostic element 408*a* is be a temperature sensor to detect the temperature imparted to reaction vessel 146. Diagnostic elements 408*b*, *e*, and *f* may be limit switches which measure the travel of the syringe pumps 134, 162, and 182. Diagnostic elements 408*c*, *d*, and *h* are pressure transducers measuring the pressure in certain flow paths of the cassette 400. For example, diagnostic element 408*d* is positioned to measure the pressure at port 121*a* of socket connector 121. Diagnostic element 408*h* is likewise positioned at port 123*a* of socket connector 123. Diagnostic element 408*c* is positioned to measure pressure of an external element, such as in the synthesizer at the source of the inert motive gas, such as $N_2$. Diagnostic element 408*g* is a sensor in eluent vial 130 that is configured to measure the pressing or piercing of a reagent vial onto its piercing cannula. For example, valve 2 has an elongate open vial housing upstanding therefrom and support an upstanding cannula therein for piercing a reagent vial inserted in the respective vial housing. Movement of the reagent vial to be pierced by the respective cannula is performed under actuation by the synthesizer device. Diagnostic element 408*g* is a sensor configured to measure this translation of the reagent vial. The diagnostic element 408*g* may also sense the pressure or force applied by the cannula to the vial. The diagnostic element 408*g* may be located in the eluent vial 130 and may sense the tip of the cannula entering the vial to a certain level. To this end, the eluent vial 130 on the cassette 400 may be an empty vial with a similar or the same septum as an eluent vial 130 containing reagent on a production cassette with the sensor located therein. The cassette 400 may have additional diagnostic elements similar to this as shown by diagnostic elements 408*g*' located on other vials as part of the cassette 400. Diagnostic elements 408*g*' may be coupled to the processing unit 402 individually (not shown). Diagnostic element 408*i* consists of elements directed to sensing stopcock rotation. It should be appreciated that while one diagnostic element 408*i* is labeled on the cassette 400, there is desirably an individual diagnostic element for each of the stopcocks on the cassette 400 as shown in FIG. 4. As described above, the cassette has twenty-five 3-way/3-position stopcocks valves 1-25, as more clearly shown in FIG. 2 and described above. Each of the diagnostic elements 408*i* may be the same. The diagnostic element 408*i* may be a limit switch which senses when the stopcock turns to a certain position. Furthermore, while each diagnostic element 408*i* is shown feeding into a common connection 406*i* to the processing unit 402, according to some embodiments, each diagnostic element 408*i* may have an individual connection to the processing unit 402. By way of exemplary embodiment, diagnostic element 408*i* depicted in FIG. 4, may monitor stopcock 20.

The cassette 400 may have a reservoir 410. The reservoir 410 may be contained within the cassette 400 or it may be located externally thereto and fluidly coupled to the fluid path of the cassette 400. This reservoir 410 may be a dead-end type reservoir to collect the working fluid of the cassette 400. The reservoir 410 may therefore take the place of the production collection vial 139 as any fluid provided from the synthesizer would move no further than the reservoir. It should be appreciated that in some embodiments, a removable collection vial 139 or similar vial may be used as the reservoir 410 (wherein the fluid provided by the synthesizer to cassette 400 would be collected off of the cassette). Thus, according to exemplary embodiments, the cassette 400 may contain a working fluid to use as part of the diagnostic process. The working fluid may consist of actual reagents and radioisotope used for production of a radiopharmaceutical. In other embodiments, the working fluid may simulate the actual reagents and radioisotope material. The working fluid may be an inert fluid used to simulate the flow of fluid through the cassette 400 in the same manner as the actual reagents and radioisotope used during the production of a radiopharmaceutical. The reservoir 410 may serve as a collection point for the working fluid. The reservoir 410 may have a number of connections to the various elements of the cassette 400 or it may have single input connection as a production collection vial would. The reservoir 410 may be removable and capable of being emptied following fluid collection.

It should be appreciated that other diagnostic elements may be included in the cassette 400 to measure additional parameters. Each of the diagnostic element can be transducers for converting a mechanical setting, such as position, pressure, or temperature, into a signal which can be record, analyzed, and transmitted. For example, the cassette 400 may have syringe simulators and stopcock simulators. Each could provide a variable resistance corresponding to the position of the syringe pump actuators and stopcock actuators. The synthesizer may actuate the syringe or stopcock to cause it move to a position. Likewise, pressure simulators are configured to transduce applied pressure to an electrical signal. The diagnostic elements may be resistance-induction-capacitance (or RLC) device/circuit and/or may employ solid state components.

While cassette 110 has been described for the synthesis of radio-labelled Flutemetamol, the present invention contemplates that the simulators of the present invention may be configured to emulate any synthesis cassette for any other radiopharmaceutical.

While exemplary embodiments of the present invention have been shown and described, it will be obvious to those skilled in the art that changes and modifications may be made without departing from the teachings of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A diagnostic synthesizer cassette for an automated synthesis device, the automated synthesis device comprising a plurality of cassette engagement devices for engaging a synthesis cassette mated to the automated synthesis device, the diagnostic synthesizer cassette comprising:

- a cassette body shaped to be received by the automated synthesis device; and
- a plurality of diagnostic elements located within or on the diagnostic synthesizer cassette, wherein each of the plurality of diagnostic elements engages with a respective one of the plurality of cassette engagement devices of the automated synthesis device and wherein one or more of the plurality of diagnostic elements measures a displacement of or an effect caused by its respective cassette engagement device,
- wherein said displacement or effect measured by the one or more diagnostic elements is obtained while the automated synthesis device performs an operational protocol that does not use a production cassette, and wherein said displacement or effect measured by the one or more diagnostic elements is provided to determine automated synthesis device performance.

2. The diagnostic synthesizer cassette of claim 1, further comprising a power source connected to at least one of the plurality of diagnostic elements.

3. The diagnostic synthesizer cassette of claim 1, wherein at least one of the plurality of diagnostic elements provides a signal corresponding to a rotation of a rotatable arm of the automated synthesis device.

4. The diagnostic synthesizer cassette of claim 1, wherein at least one of the plurality of diagnostic elements provides a signal corresponding to an application of one of a positive pressure and a negative pressure detected at a gas port from the automated synthesis device.

5. The diagnostic synthesizer cassette of claim 1, wherein at least one of the plurality of diagnostic elements detects linear movement of an indicator supported by the simulator body and provides a signal corresponding to the linear movement of the indicator.

6. The diagnostic synthesizer cassette of claim 1, wherein at least one of the plurality of diagnostic elements detects reciprocal linear movement of an elongate piston rod supported by the simulator body and provides a signal corresponding to the reciprocal linear movement of the elongate piston rod.

7. The diagnostic synthesizer cassette of claim 1, wherein at least one of the plurality of diagnostic elements detects temperature of a heating element of the automated synthesis device and provides a signal corresponding to the temperature of the heating element.

8. The diagnostic synthesizer cassette of claim 1, wherein at least one of the plurality of diagnostic elements detects pressure along a flow path or at a reaction vial of the automated synthesis device and provides a signal corresponding to the pressure along the flow path or at the reaction vial of the automated synthesis device.

9. The diagnostic synthesizer cassette of claim 1, further comprising means for communicating signals received by each of the plurality of diagnostic elements to a computerized comparator.

10. The diagnostic synthesizer cassette of claim 9, wherein the means for communicating the signals comprises a wireless communication device.

11. The diagnostic synthesizer cassette of claim 9, wherein the means for communicating the signals comprises at least one of a wired network and a computer network.

12. The diagnostic synthesizer cassette of claim 1, wherein the simulator body further comprises indicating means for indicating the signals.

13. A method of diagnosing performance of an automated synthesis device comprising:

- mating the diagnostic synthesizer cassette of claim 1 to the automated synthesis device;
- engaging each of a plurality of diagnostic elements, located within or on the diagnostic synthesizer cassette, with a respective one of a plurality of cassette engagement devices located in the automated synthesis device;

instructing, by at least one computer processor, the automated synthesis device to perform an operational protocol for operating on the diagnostic synthesizer cassette; and measuring, by one or more of the plurality of diagnostic elements, a displacement of or an effect caused by its respective cassette engagement device, resulting from operating the automated synthesis device on the diagnostic synthesizer cassette, wherein said displacement or effect measured by the one or more diagnostic elements is obtained while the automated synthesis device performs an operational protocol that does not use a production cassette, and wherein said displacement or effect measured by the one or more diagnostic elements is provided to determine automated synthesis device performance.

14. The method of claim 13, wherein the recording step further comprises recording time and duration of operating the automated synthesis device.

15. A system for diagnosing performance of an automated synthesis device comprising:

the diagnostic synthesizer cassette of claim 1;

a pre-determined specification record comprising expected outcomes of an effect on the diagnostic synthesizer cassette by the automated synthesis device when conducting an operational protocol; and a computerized comparator for comparing signals received from the diagnostic synthesizer cassette with the pre-determined specification record.

16. The diagnostic synthesizer cassette of claim 1, wherein the plurality of diagnostic elements is modular in structure.

17. The diagnostic synthesizer cassette of claim 2, wherein the power source is at least one of an internal power source and an external power source.

18. The diagnostic synthesizer cassette of claim 1, wherein the plurality of diagnostic elements comprises transducers for converting a mechanical setting to the signal.

19. The diagnostic synthesizer cassette of claim 1, wherein the plurality of diagnostic elements comprises at least one of a limit switch, a pressure meter, a pressure transducer, and a temperature sensor.

20. The diagnostic synthesizer cassette of claim 15, wherein based on the comparison by the computerized comparator, a determination is made whether the automated synthesis device is operating properly.

* * * * *